United States Patent
Zipfel, Jr. et al.

(10) Patent No.: US 7,932,777 B1
(45) Date of Patent: Apr. 26, 2011

(54) SWITCHING AMPLIFIER FOR DRIVING REACTIVE LOADS

(76) Inventors: George Gustave Zipfel, Jr., Summit, NJ (US); Christie Lewis Zipfel, Summit, NJ (US)

(*) Notice: Subject to any disclaimer, the term of this patent is extended or adjusted under 35 U.S.C. 154(b) by 0 days.

(21) Appl. No.: 10/783,499

(22) Filed: Feb. 20, 2004

Related U.S. Application Data

(60) Provisional application No. 60/457,050, filed on Mar. 24, 2003.

(51) Int. Cl.
*H03F 3/38* (2006.01)
(52) U.S. Cl. .......... 330/10; 330/207 A; 330/251; 363/41
(58) Field of Classification Search .......... 330/10, 330/207 A, 251, 149, 151, 291, 293; 363/41; 367/99
See application file for complete search history.

(56) References Cited

U.S. PATENT DOCUMENTS

| | | | |
|---|---|---|---|
| 4,628,275 A | | 12/1986 | Skipper et al. |
| 4,968,948 A | * | 11/1990 | Tokumo et al. .......... 330/10 |
| 5,001,746 A | * | 3/1991 | Nishijima .......... 379/93.37 |
| 5,204,551 A | | 4/1993 | Bjornholt |
| 5,235,559 A | * | 8/1993 | Ogushwitz et al. .......... 367/99 |
| 5,264,752 A | | 11/1993 | Savicki |
| 5,442,317 A | * | 8/1995 | Stengel .......... 330/10 |
| 5,473,526 A | | 12/1995 | Svensson et al. |
| 6,211,728 B1 | | 4/2001 | Chen et al. |
| 6,229,387 B1 | * | 5/2001 | Mieda et al. .......... 330/3 |
| 6,229,393 B1 | | 5/2001 | Daners |
| 6,281,767 B1 | * | 8/2001 | Lastrucci .......... 333/167 |
| 6,486,643 B2 | | 11/2002 | Liu |
| 6,653,897 B2 | * | 11/2003 | Sawashi .......... 330/10 |
| 6,961,438 B1 | * | 11/2005 | Fujita .......... 381/182 |
| 6,967,527 B2 | * | 11/2005 | Fukushima .......... 330/10 |
| 6,985,034 B1 | * | 1/2006 | Prokin et al. .......... 330/251 |
| 2001/0035696 A1 | | 11/2001 | Knowels et al. |

FOREIGN PATENT DOCUMENTS

WO   WO-01/01554   *   1/2001

OTHER PUBLICATIONS

"The Illustrated Dictionary of Electronics" Sixth Edition by Stan Gibilisco TAB Books 1993 p. 151.*
McGraw-Hill Electronics Dictionary Sixth edition by Neil Sclater and John Markus McGraw Hill 1997 p. 106.*

* cited by examiner

*Primary Examiner* — Michael B Shingleton
(74) *Attorney, Agent, or Firm* — Ronald D. Slusky

(57) ABSTRACT

A switching amplifier drives balanced piezoelectric or other capacitive or reactive loads with a minimum physical electronics volume, enabling a compact arrangement that can combine amplifier and transducer at the same physical location. Power supply current is minimized by using two or more transducers driven with phase-shifted signals, resulting in stored energy being cycled between the transducers rather than being carried over the power supply lines for storage in a power supply. Auxiliary power supply capacitors to store energy coming out of the load can thus be minimized. The modulation scheme puts the switching frequencies in common-mode while the baseband signals are differential mode. The common-mode switching frequency signals are blocked from the loads by a common-mode inductor. The common-mode inductor can be physically small as a result of the large baseband load currents being in differential mode. Low-volume load filters are made possible by the fact that they are not called upon to filter signals at the fundamental switching frequency but only at higher frequencies. The loads are biased independently of the baseband signals. The switching amplifier can drive balanced loads comprising two, three or more individual load elements.

40 Claims, 9 Drawing Sheets

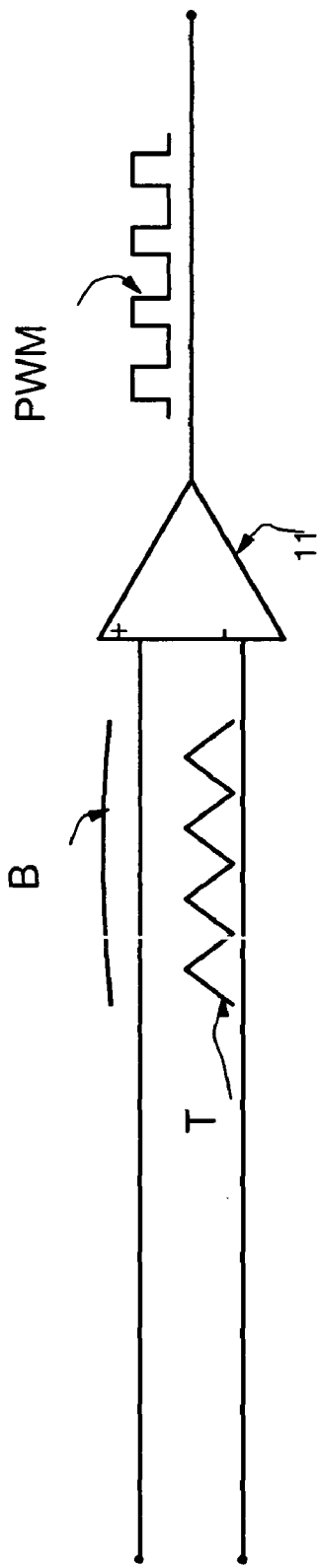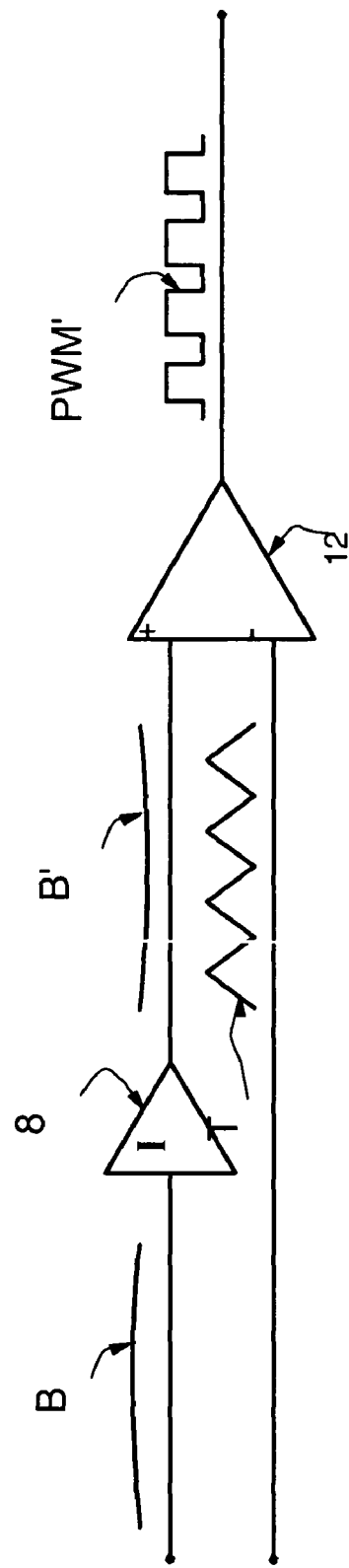

SWITCHING AMPLIFIER FOR DRIVING REACTIVE LOADS

CROSS-REFERENCE TO RELATED APPLICATION

This application claims the benefit of U.S. provisional patent application No. 60/457,050 filed Mar. 24, 2003, incorporated herein by reference.

FEDERALLY SPONSORED RESEARCH

This work was supported under Office of Naval Research contract N00014-01-C-0063. The government has certain rights in this invention.

BACKGROUND OF THE INVENTION

The present invention relates to amplifiers for driving reactive loads, such as piezoelectric transducers.

Piezoelectric transducers transform electrical energy into mechanical energy and vice versa. Piezoelectric material stores electrical energy that is not converted into mechanical energy. This stored electrical energy is typically larger than the converted energy. The impedance of a piezoelectric transducer is predominantly capacitive, so that the energy is stored as charge on the capacitor. When a time-varying signal is applied from an amplifier, the capacitive load charges when the voltage rises and discharges when the voltage falls. During discharge, energy flows out of the load and into the amplifier.

In class A or B amplifiers, there is no provision for capturing and saving energy coming out of the load for later reuse when energy flows back into the load. Rather, energy flowing out of the load is converted to heat, resulting in inefficiency. There are at least two amplifier design approaches that employ energy recovery and reuse—multi-rail amplifiers and switching (class D) amplifiers.

An example of a multi-rail amplifier used in such an application is disclosed in U.S. Pat. No. 5,264,752 issued Nov. 23, 1993 to Savicki. A multi-rail amplifier has many power supplies, providing a number of closely spaced power supply voltages, that can absorb energy and store it for reuse. A linear amplifier is disposed between each rail, with only one of these being in its linear operating range at any given time. The others are railed and consequently have low power dissipation. Net dissipation is reduced because the amplifier that is dissipating has a voltage drop that is only a fraction of the maximum output voltage swing. Efficiency increases with the number of rails. Energy is being reused because current inflow from the load is used to charge storage capacitors in the power supplies having rail voltages below that of the amplifier operating in its linear region. Energy storage is in electrolytic capacitors that are not deeply cycled. Thus, disadvantageously, a relatively large amount of physical space is taken up by the storage capacitors.

An advantage of multi-rail amplifiers is that they present much less severe design problems than do switching amplifiers. In particular, while switching does occur in the multi-rail amplifier, the ideal signal is intrinsically continuous, resulting in a much lower level of high frequency signal components and consequently reduced electromagnetic interference. Among the disadvantages of the multi-rail approach is that in order to achieve comparable efficiencies to switching amplifiers, 20 to 40 rails are required. The resulting high component count means that a multi-rail amplifier solution is useful where volume and cost are not major considerations. For that same reason, however, use of a multi-rail amplifier may be disadvantageous, or completely impractical, in applications having stringent volume requirements, such as submarine-based sonar systems, or where cost is a major concern.

Switching amplifiers, by contrast, are at least somewhat more compact and inexpensive. Switching amplifiers commonly operate by connecting a power supply voltage ($V_{supply}$) across the load with alternating polarity. That is, the voltages $V_{supply}$ and $-V_{supply}$ are alternately impressed across the load. This switching is accomplished using, for example, power field-effect transistors (FETs) or insulated gate bipolar transistors (IGBTs) arranged in an H-bridge or full bridge configuration. The bridge is switched by a pulse-width-modulated (PWM) signal generated, for example, as a function of a high-frequency switching waveform and a baseband signal with which the load is to be driven. An amplified version of the baseband signal is thus impressed across the load by virtue of the fact that the average voltage across the load depends on the percentage of the time that the supply voltage is connected across the load with each polarity, this being a function of the baseband signal.

The signals appearing in a switching amplifier are within two distinct frequency bands—one at the frequencies of the load signal (baseband), and the other at the much higher switching frequencies (switching band) which start at and extend upward from the fundamental frequency of the switching waveform, which is also the fundamental frequency of the pulse-width-modulated signal. In a high performance amplifier suitable for baseband frequencies up to 100 kHz, the fundamental switching frequency will be at least 1 MHz, and the overall switching signal within the amplifier will have significant frequency components as high as 100 MHz.

In the optimal switching amplifier application, as much current or energy flowing out of the load as possible is routed back to the power supply. The power supply is designed to store the inflowing charge, thereby capturing energy for reuse. A conventional way to store energy in the power supply for reuse is through electrolytic storage capacitors. When current is flowing out of the load and into the power supply, the storage capacitor charge is slightly increased. This charge then flows out of the storage capacitor when energy needs to be sent to the load.

Although the switching amplifier solution does not involve the high component counts characteristic of multi-rail amplifiers, it also has its drawbacks.

In particular, the variation in current flow through the power supply resulting from the flow of baseband current to and from the load can cause variations in power supply voltage, giving rise to load signal distortion. Such "ripple" currents—not to be confused with the ripple voltage on a power supply's DC value that result when a power line frequency AC power signal is rectified—can be large, requiring the use of physically large storage capacitors in order to smooth them out. Indeed, the storage capacitors often dominate the volume of the power supply. Thus although the amplifier switching circuitry can be small, the physical volume of the electrolytic capacitors in the power supply can be many times the physical volume of the circuitry. As with the multi-rail approach, this is a disadvantage in applications in installations where physical space is at a premium.

A further drawback of the switching amplifier approach arises when the switching amplifier is used to drive capacitive loads. In particular, in any switching amplifier application, low pass load filters must be placed between the switching circuitry and the load in order to block high frequency currents from flowing through the load. Such currents will otherwise cause dissipative loss, damage the load and impair the function of the semiconductor switches. When the load is inductive, as is the case when the switching amplifier is used to drive a motor, for example, the load itself can provide some of the switching frequency filtering. Indeed, the load filter design principally needs to be concerned with providing effective filtering at those switching signal frequencies that are so high that the load no longer appears inductive, e.g., at higher order harmonics of the switching signal.

However, the impedance of a capacitive load, such as a piezoelectric transducer, decreases with frequency. In fact, in piezoelectric transducer applications, the load is essentially a dead short at the switching frequencies. A more complex and physically larger load filter is thus required for capacitive loads. The required high impedance of the load filter at the switching frequencies is typically supplied by one or more inductors. Since these inductors must carry the full baseband currents flowing to the load, they must be made physically large enough to prevent magnetic core saturation by the baseband currents. This constraint is, again, a problem in applications where physical space is at a premium.

Because the operation of a switching amplifier involves high frequency switching signals, e.g., signals in the 1-100 MHz range as described above, a switching amplifier is a radio-frequency (RF) device. Thus a further concern in the design of switching amplifiers in that the design of the switching amplifier must take into account such RF effects as electromagnetic interference and parasitic component complications. Designing the load filters is thus in large part an RF design problem and it can be difficult to achieve the desired load filtering functionality while addressing the aforementioned or other RF effects.

SUMMARY OF THE INVENTION

In a switching amplifier embodying a first aspect of the invention, a substantial portion of the baseband current is isolated from the power supply—illustratively by being kept internal to the load. As a result, the currents, especially time-varying currents, that flow through the power supply are much lower than they otherwise would be. This, in turn, results in much more relaxed ripple-current-smoothing capabilities and lower energy storage requirements for the power supply. The power supply's storage elements can thus be made much smaller than in the prior art, thereby achieving a smaller physical volume for the power supply overall and thus significantly overcoming the drawbacks of prior art switching amplifiers relating to the large physical volume of the power supply storage elements. (Certain embodiments may utilize multiple power supplies. The term "power supply" as used herein is intended to encompass such arrangements.)

In particular embodiments of switching amplifiers embodying this aspect of the invention, baseband currents are kept from flowing to the power supply by driving two or more loads concurrently in a phased manner. Charge that was stored in one load and thereafter flows out of that load is not transferred to the power supply but rather to the other load(s) which later transfer it back. There is thus little net change in the combined charge stored by the loads. Rather, charge oscillates between or among the loads at the baseband frequency, with little net charge being communicated to, or drawn from, the power supply. Alternatively stated, the all of the current at baseband frequencies flowing out of one or more of the loads at a given time flows into one or more of the others of the loads. Two loads, for example, are illustratively driven 180 degrees out of phase with respect to one another in a push-pull manner. The two or more loads may be connected in a mechanical push-pull configuration as well to form a compound transducer.

The aforementioned mode of operation is illustratively achieved by driving each load with a respective switching signal, each carrying a respective baseband signal. The baseband signals are in a predetermined phase relationship, which causes the aforementioned charge oscillation to occur. In an illustrative embodiment in which two loads are driven, the respective baseband signals are the inverse of one another, i.e., 180 degrees out of phase with respect to one another.

Beyond the reduction in physical volume of the power supply storage elements, a further advantage of reducing the baseband current flowing through the power supply is that the current capacity requirements on power supply lines is reduced, allowing for less heavy power supply cables. In addition, because only a very low level of baseband current flows in the power supply cables, those cables are effectively decoupled from the load. This decoupling reduces undesirable interactions with the load that can occur through a shared power connection in applications where multiple switching amplifiers are connected to a common power supply line.

The smaller physical volume of the power supply also means that the power supply can be collocated with the switching amplifier and the load in a single package that is compact enough to be installed in locations where space limitations would not otherwise have allowed this. Submarine-based sonar systems are such an application. Such collocation allows the power supply cables, as well as the cables/wires connecting the amplifier circuitry per se to the load, to be physically shorter than otherwise. As a result, their impedance is sufficiently small as to not give rise to voltage drops that could affect other switching amplifiers using the same power supply. Concerns about electromagnetic interference and other effects are also significantly reduced when the wires and cables are shorter.

If only one load needs to be driven, one or more standard reactive elements whose impedance balances that of that one load can be used in place of the other load(s). If the load is capacitive, such as a piezoelectric transducer, the reactive element used to balance it could be a capacitor, such as a polyester film capacitor. Such a capacitor will be deeply cycled, so that usable energy storage density will be higher than for an electrolytic capacitor with similar functionality so that its physical volume will be significantly less, thereby preserving the lessened-physical-volume advantages of the invention.

This first aspect of the invention can be understood as more broadly enabling the design of a switching amplifier in which some desired load signal variable constraint is realized. Achieving a substantially zero net current flow through the loads is but one of these constraints, albeit a highly advantageous one, for the reasons set forth hereinabove.

A switching amplifier embodying a second aspect of the invention utilizes at least two switching signals driving at least one load. The two or more switching signals are processed within the switching amplifier in such a way as to subtractively combine their respective frequency components at at least one frequency. As a result, the load filtering circuitry that isolates the switching frequencies from the load(s) does not have to be looked to to filter out that particular frequency component or components. This is advantageous in that the reduced requirements on the load filtering circuitry can mean that the load filter can be realized by components that take up significantly less volume.

In particular embodiments of a switching amplifier embodying this second aspect of the invention, it is the fundamental switching frequency of each switching signal that is subtractively combined with the fundamental switching frequency of the other switching signals. The load filtering circuitry thus needs only to filter out higher-order switching frequencies. As explained in detail hereinbelow, this allows for the use of a load filter inductor that is much less bulky than would otherwise be the case, thereby further contributing to a compact overall amplifier design. It also substantially ameliorates the aforementioned RF design issues.

A switching amplifier embodying the principles of the invention may implement one or the other of the two above-described aspects of the invention without implementing the other. However, advantageous embodiments of the invention implement both aspects. In such a switching amplifier driving two loads, for example, a respective one of two switching signals is applied to one end of each load. The respective fundamental frequency components of the switching signals are in phase with one another, this being illustratively achieved by generating the two switching signals from the same modulating waveform. The baseband signals that are carried in the switching signals are the inverse of one another. The two switching signals are applied to respective ones of the two loads via respective legs of a common-mode inductor. The latter does not allow common-mode signals in the two legs to pass on to the loads. The fundamental switching frequency components of the two switching signals constitute such a common-mode signal. Those components are thus prevented from reaching the loads. At the same time, the fact that the two baseband signals are the inverse of one another means that the baseband currents in the loads are also the inverse of one another. The baseband currents thus constitute a differential mode signal and are not significantly affected by the common-mode inductor. The other ends of the loads are connected in common, thereby allowing charge flowing out of one load to flow into the other.

The principles of the invention as just described are readily extended to switching amplifiers that can drive three or more loads in response to a respective number of switching signals having appropriately phased baseband components.

BRIEF DESCRIPTION OF THE DRAWING

FIGS. 2A and 2B show circuitry for generating pulse-width-modulated signals to be applied to the switching amplifier of FIG. 1, as well as to switching amplifiers embodying the principles of the invention shown in other FIGS. hereof;

DETAILED DESCRIPTION

Figure 1:
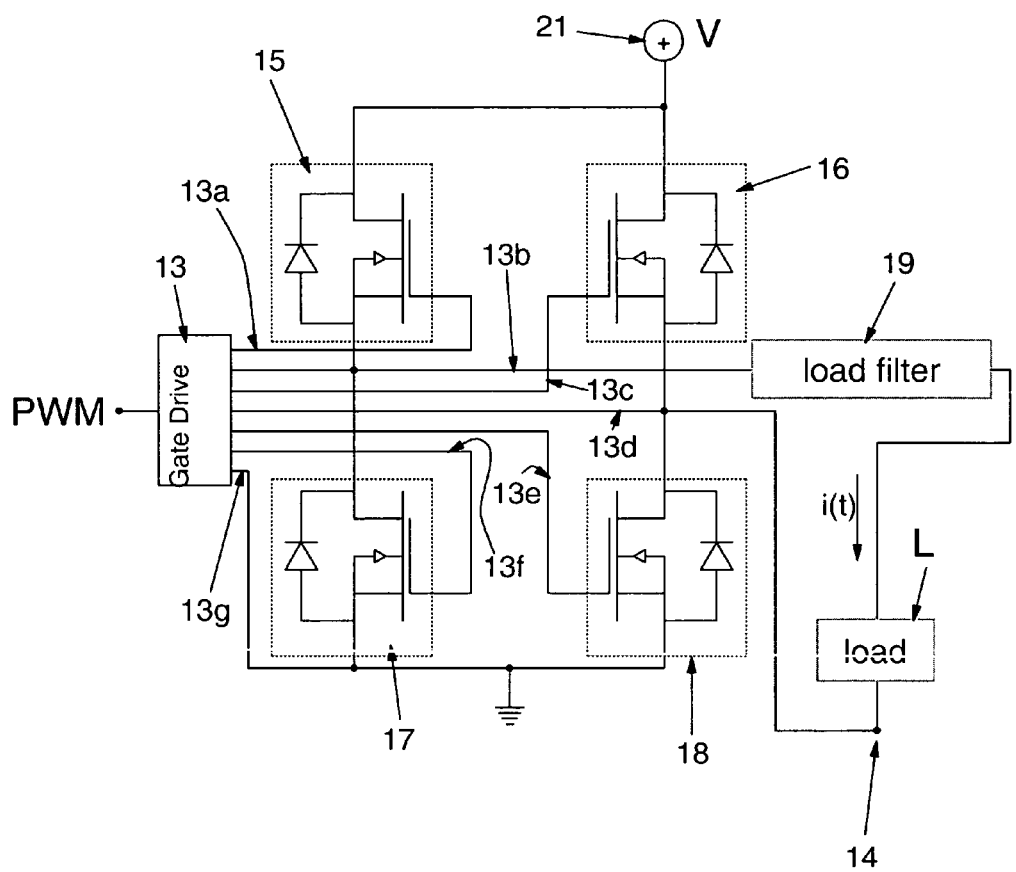
FIG. 1 is a circuit diagram of a prior art switching amplifier.

FIG. 1 is a circuit diagram of a typical prior art switching amplifier 10 that drives a load L with a baseband signal. Load L is illustratively a piezoelectric transducer that could be used, for example, to drive a piston that generates an acoustic signal for use in a sonar system, for example.

Figure 3A:
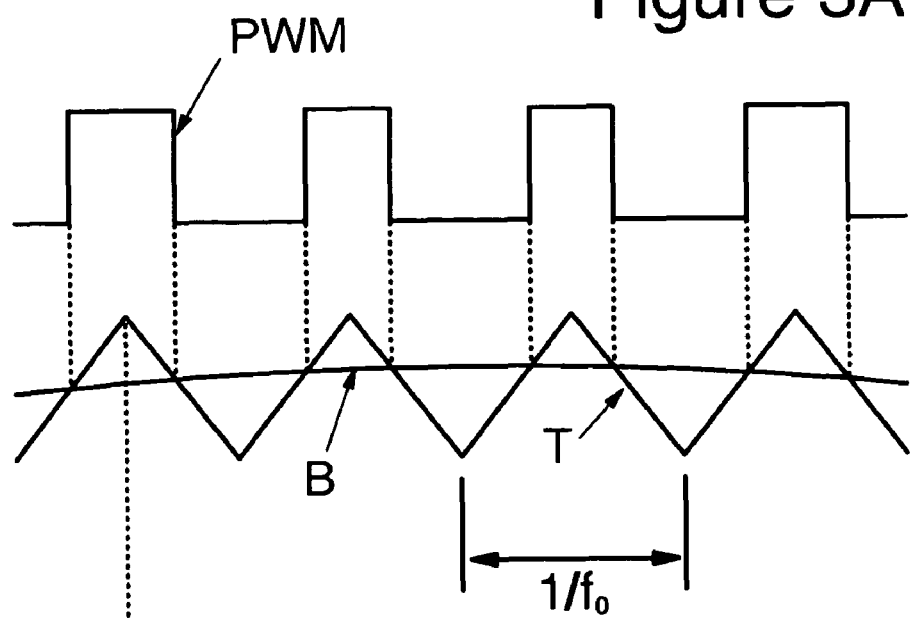
FIGS. 3A and 3B show how the circuitry of FIGS. 2A and 2B processes a switching waveform with baseband signals in order to generate the pulse-width-modulated signals.

The input signal to switching amplifier 10 is a pulse-width-modulated signal PWM. As shown in FIGS. 2A and 3A, signal PWM is generated by comparator 11 as a function of the aforementioned baseband signal—baseband signal B—and a switching waveform—triangle wave T. Baseband signal B may be, for example, a sine wave at a frequency $f_B$ of 75 KHz and triangle wave T may have a fundamental frequency $f_0$ of, for example, 1 MHz (its period thus being $1/f_0$). The output of comparator 11 is high when the amplitude of triangle wave T exceeds that of baseband signal B and is otherwise low. Thus the comparator output signal PWM comprises a train of pulses whose widths vary inversely with the amplitude of baseband signal B. The pulses of signal PWM swing between, illustratively, +5 and zero volts. The amplitude of baseband signal B is such that at its upper or lower extremes the pulse widths of signal PWM are zero or $1/f_0$, respectively. This corresponds to full modulation.

Returning to FIG. 1, signal PWM is applied to gate driver 13 of amplifier 10. Gate driver 13 responds to signal PWM by generating voltages on its various output leads 13a through 13f. Gate driver 13 is also connected to ground via lead 13g. The signals on leads 13a through 13f drive an H-bridge comprising FETs 15, 16, 17 and 18. When signal PWM is high, the signals on leads 13a through 13f are such that the gate-to-source voltage of FETs 15 and 18 is (approximately) +15 volts and the gate-to-source voltage of FETs 16 and 17 is at or close to 0 volts. This causes FETs 15 and 18 to be conductive, or ON and FETs 16 and 17 to be non-conductive, or OFF. Load filter 19 is thus connected via FET 15 to power supply 21, and node 14 is connected to ground via FET 18. The voltage V supplied by power supply 21 is thus impressed across load L with a first polarity, causing a current i(t) to flow through the load in the direction shown. When signal PWM is low, the signals on leads 13a through 13f are such that FETs 16 and 17 are ON and FETs 15 and 18 are OFF. Load filter 19 is thus connected via FET 17 to ground, while node 14 is connected to power supply 21 via FET 16. The voltage V supplied by power supply 21 is thus impressed across load L with a reversed polarity, causing a current i(t) to flow through the load in the direction opposite to that shown. The average voltage across load L over time varies between V and −V, depending on the percentage of the time that signal PWM is high as compared to when it is low. That percentage is a function of baseband signal B. It is in this way that the current through load L includes an amplified version of the input baseband signal B.

Signal PWM has substantial energy in two frequency regions, these being referred to as the baseband frequencies and the switching frequencies. The baseband frequencies have significant energy content at and near the baseband signal frequency $f_B$, i.e., 75 KHz. The switching frequencies begin at approximately the fundamental frequency $f_0$ and continue upward from there. As noted earlier, it is disadvantageous for significant levels of energy at the switching frequencies to reach the load. Rather, it is desirable for the current through the load to be, to the extent possible, solely at or near the baseband frequencies. To this end, load filter 19 attenuates signals that are higher than the baseband frequencies, thereby preventing most of the switching frequency energy from reaching load L.

As can be seen from FIG. 1, all of the current at the baseband frequencies applied to load L also passes through the power supply 21, which has disadvantages as described hereinabove. In a switching amplifier embodying one aspect of the invention, those disadvantages are significantly overcome by designing the amplifier in such a way that baseband currents driving the load are substantially isolated from the power supply—illustratively by being kept internal to the load.

Figure 4A:
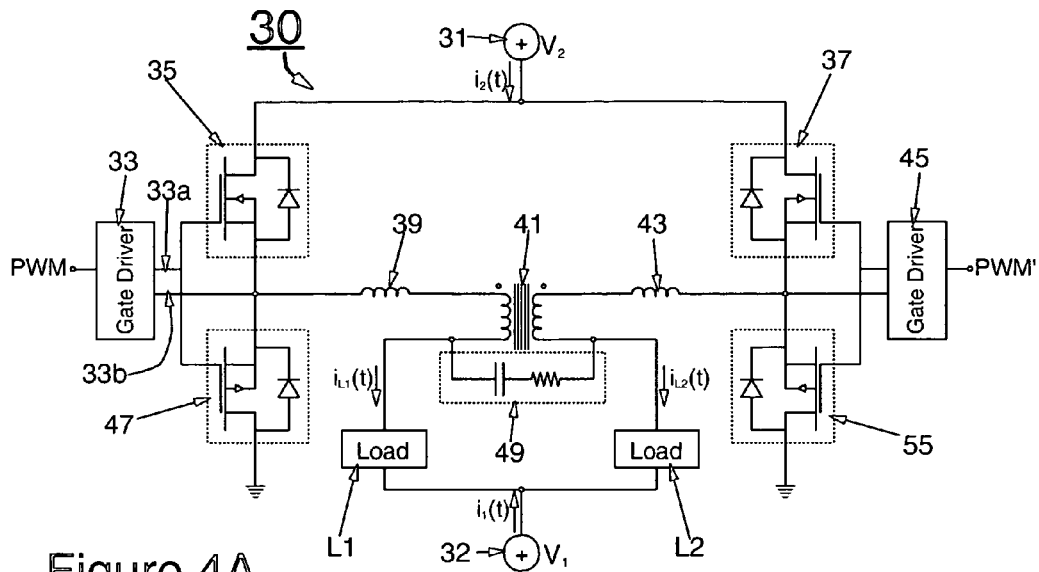
FIG. 4A is a circuit diagram of a balanced dual half-bridge switching amplifier embodying the principles of the invention using complementary N channel FETs and P channel FETs.

Switching amplifier 30 shown in FIG. 4A is such an amplifier. Switching amplifier 30, in particular, is designed to drive two loads simultaneously using separate switching signals. The term "switching signal" is used herein to refer to the signals that flow through the switching amplifier's bridges in response to the application of the pulse-width-modulated signals to the switching amplifier's gate drivers. The baseband components of the switching signals are the inverse of one another, with the loads being interconnected in such a way that the baseband current flowing out of one load during a given baseband frequency half-cycle is drawn into the other load rather than flowing into the power supply. Switching amplifier 30 uses a half-bridge to drive each of its two loads L1 and L2 rather than using an H-bridge, as is used in prior art switching amplifier 10. (However, other embodiments of the invention can use H-bridges, as described hereinbelow.)

In particular, signal PWM is applied to gate driver 33 of amplifier 30. The latter controls a half-bridge comprising FETs 35 and 47 via its output leads 33a and 33b. In particular, when signal PWM is high, lead 33a is (approximately) 10 volts positive with respect to lead 33b, causing FET 35 to be ON and FET 47 to be OFF. A current path is thus established comprising power supply 31 (supplying a voltage $V_2$), FET 35, inductor 39, common-mode inductor 41, load L1 and power supply 32 (supplying a voltage $V_1$), whereby current $i_{L1}(t)$ flows through load L1. Conversely, when signal PWM is low, the signals on leads 33a and 33b are reversed, causing FET 35 to be OFF and FET 47 to be ON. A current path is thus established comprising power supply 32, load L1, common-mode inductor 41, inductor 39, FET 47 and ground, again causing current $i_{L1}(t)$ to flow through load L1. Virtually all of the e.m.f. for that current is supplied from energy that was stored in common-mode inductor 41, load L2 and power supply $V_2$ when signal PWM was high, rather than from power supply 32, as described in further detail below.

Switching amplifier 30 further includes gate driver 45, which operates a second half-bridge comprising FETs 37 and 55 in substantially the same manner that gate driver 33 operates the half-bridge comprising FETs 35 and 47. Thus FET 37 is ON (OFF) when FET 55 is OFF (ON). Significantly, however, the input signal to gate driver 45 is a signal PWM' that differs from signal PWM in that it is generated in response to a baseband signal B' that is an inverted version of baseband signal B, but using the same switching waveform, i.e., triangle wave T. Signal PWM' is generated from baseband signal B by an inverter 8 and comparator 12, as shown in FIG. 2B, and as further depicted in FIG. 3B. The switching signal thus generated in response to signal PWM' drives a load L2 that is substantially identical, or is at least impedance-matched, to load L1. The current through load L2 is $i_{L2}(t)$.

Inductors 39 and 43 and a common-mode inductor 41 serve the same general function as filter 19 in amplifier 10—that is, to isolate switching frequency energy from the loads. Their design is quite different, however, pursuant to the principles of the invention, as explained hereinbelow.

Figure 3B:
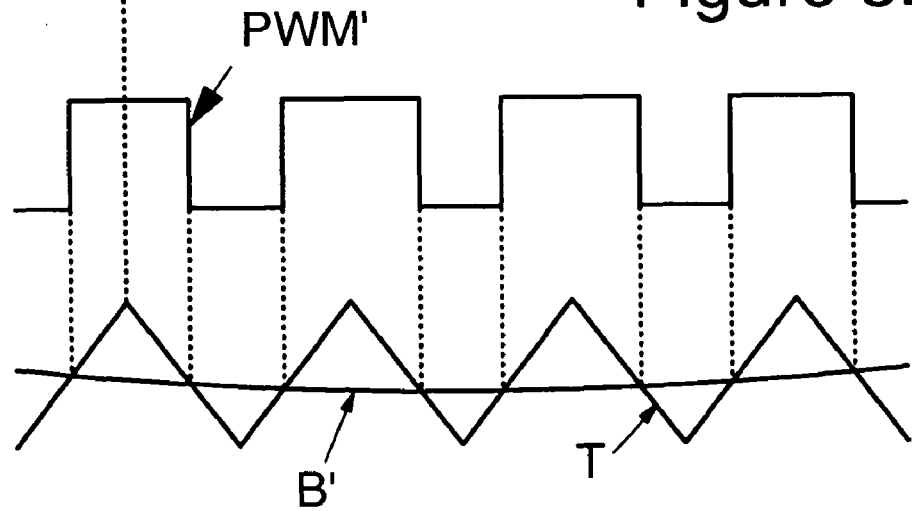

As can be seen from FIGS. 3A and 3B, the pulses of signals PWM and PWM' are aligned with one another since they are generated in response to the same switching waveform, i.e., triangle wave T. Thus FETs 35 and 37 are switched in synchrony, although they do not turn ON and OFF at precisely the same instant due to the fact that the aligned pulses do not have the same widths because they are generated from different baseband signals, i.e., signal B and B'. A similar observation can be made relative to FETs 47 and 55.

As a consequence of the fact that the baseband signal used to generate signal PWM' is an inverted version of the baseband signal used to generate signal PWM, the baseband current flowing through load L1 is the inverse of—that is, flows in the opposite direction from—the baseband current flowing through load L2. Loads L1 and L2 are thus driven in a push-pull fashion. That is, as baseband current flows through load L1, a substantially equal amount of baseband current flows in the opposite direction through load L2. Since very little switching frequency current flows through loads L1 and L2, it is convenient to regard the total currents $i_{L1}(t)$ and $i_{L2}(t)$ flowing therethrough as being exclusively baseband currents. Thus, as desired, the net baseband current flow out of power supply 31 is $[i_{L2}(t)+i_{L1}(t)] \approx 0$ and is independent of the value of $V_1$. Similarly, the net baseband current flow out of power supply 32 is $[i_{L1}(t)+i_{L2}(t)] \approx 0$.

It will be appreciated from the foregoing that loads L1 and L2 can be viewed as a balanced load with the baseband signal driving them being a differential mode signal. This circuit configuration can equivalently be characterized as implementing charge swapping for the capacitive loads L1 and L2, each load having a capacitance C. If the baseband voltage across one load is v(t) and is −v(t) across the other, the charge stored in the two loads is $C*v(t)$ and $-C*v(t)$, respectively. Total charge is therefore substantially constant. Common-mode inductor 41 presents very little impedance to differential mode signals applied thereto and thus has virtually no effect on baseband currents $i_{L1}(t)$ and $i_{L2}(t)$.

Given that most of the charge stored in each load is simply transferred back and forth between itself and the other load during each baseband signal cycle, most of the energy drawn from the power supplies once the loads' inherent capacitances have charged up is due to losses in the circuit and loads. Thus the currents $i_1(t)$ and $i_2(t)$ flowing from power supplies 31 and especially 32, respectively, are small compared to the loads' baseband currents $i_{L1}(t)$ and $i_{L2}(t)$. The energy drawn from power supply 31 in steady-state operation is significantly less than the amount of energy stored in, and passed between, the two loads. The net energy drawn from power supply 32 is negligible. The energy that is drawn from the power supplies is only that necessary to make up for the energy that is consumed by the loads in generating acoustic energy, and that is dissipated as heat by the FETs and other components, etc.

Illustratively, the two power supply voltages $V_1$ and $V_2$ are not necessarily equal to one another. In fact, in the present embodiment, $V_2$ and $V_1$ are not related as long as the load impedance for DC is very large. An advantage of this is that a DC bias voltage can be applied to the loads independent of the baseband signal and not change amplifier performance. As previously noted, loads L1 and L2 are illustratively piezoelectric transducers, or "stacks," and piezoelectric materials have better performance when operated with a bias. The bias allows higher drive levels without depolarization. Adjustment of the bias allows the voltage excursion range across the stack to be optimized for the piezoelectric material being used. Moreover, biased operation permits the use of electrostrictive materials. It turns out that current $i_2(t) \ll i_1(t)$. That is, most of the energy supplied from the power supplies is provided from power supply $V_2$. The reason for this is explained at a more opportune point hereinbelow.

In accordance with a second aspect of the invention, a switching amplifier may be designed in such a way that current at the fundamental switching frequency $f_0$ is kept from reaching the load(s) via the subtractive combination of the fundamental switching frequency components of two or more switching signals—in this case signals PWM and PWM' generated from a common switching waveform, i.e., triangle wave T, their fundamental switching frequency components are, in fact, in phase with one another and thus comprise a common-mode signal relative to the overall load comprising L1 and L2. Those fundamental switching frequency components are thus subtractively combined by common-mode inductor 41 so that very little energy at frequency $f_0$ reaches loads L1 and L2.

Figure 5A:
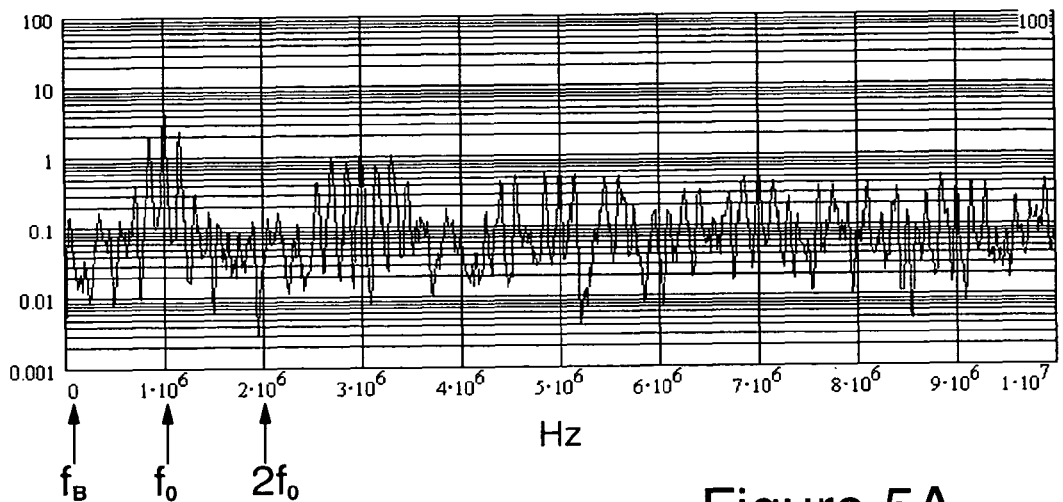
FIGS. 5A and 5B show the magnitude of the Fourier coefficients of various switching signal waveforms, useful in explaining the principles of the present invention.
Figure 5B:
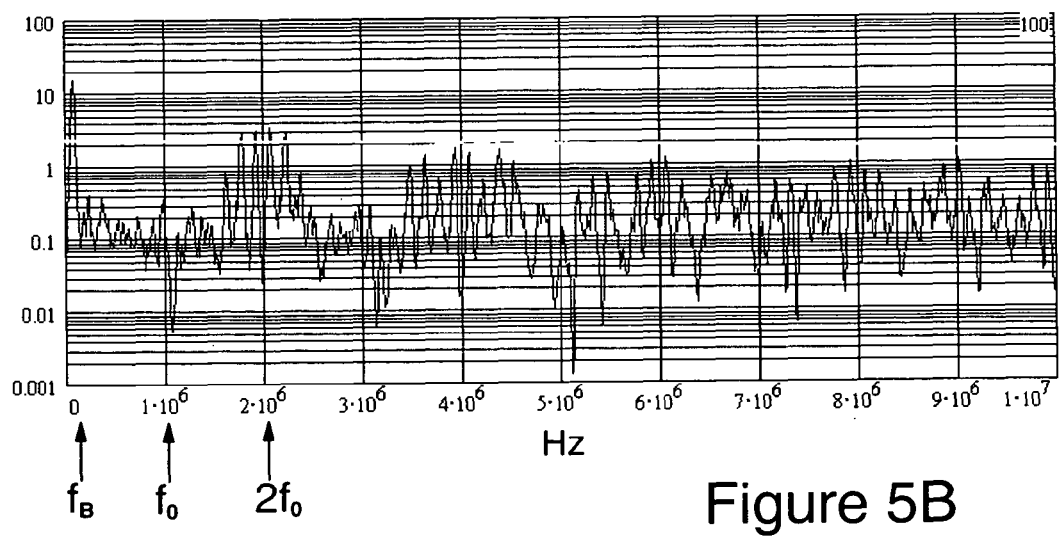

As an example, FIG. 5A shows the magnitude of the Fourier transformed common-mode voltage of the pulse-width-modulated signals PWM and PWM', which is one half of their sum. Note that these signals' common-mode has its primary component centered at $f_0$, that is, at 1 MHz, with 75 kHz side bands. There is little common-mode energy at $f_B$, i.e., 75 KHz, because signals B and B' are 180 degrees out of phase from one another. FIG. 5B shows the magnitude of the Fourier transformed differential mode voltage of pulse-width-modulated signals PWM and PWM', which is given by their difference. Note that there is a large baseband peak at 75 kHz because signals B and B' are different mode signals. There is little differential mode energy at $f_0$ because the components of signals PWM and PWM' at $f_0$ are in phase with one another. Since common-mode inductor 41 prevents common-mode signals from passing to the loads L1 and L2 but presents virtually no impediment to the passage of differential mode signals, FIG. 5B can be understood as depicting the frequency distribution of the signals that would pass to loads L1 and L2 given the effects of common-mode inductor 41. Energy at higher order switching frequencies would still remain, however, as seen in FIG. 5B, because the frequency components within the two switching signals are not all in phase with one another at those higher frequencies. That is, they are not common-mode signals and thus are not blocked by common-mode inductor 41, so that there is a residual differential mode component in the switching band. This is a result of the width modulation in signals PWM and PWM'.

This residual differential mode signal is removed by inductors 39 and 43 and residual switching band currents in the load are further reduced by the RC bypass filter 49.

An important advantage of the invention may now be more fully explained and appreciated. If two loads such as loads L1 and L2 were each driven by a respective prior art switching amplifier, such as switching amplifier 10, the total physical volume of the inductors in the required load filters (e.g., a filter 19 for each of those two prior art switching amplifiers) would be substantially greater than the volume of the three inductors 39, 41 and 43 used in switching amplifier 30. Among the reasons for this are the fact that the load inductors 39 and 43 need only be designed to filter out frequencies at and above $2f_0=2$ MHz (in this example). Since the impedance of an inductor is a function of frequency, inductors 39 and 43 thus need only to have half the inductance of a load filter that, like filter 19, would be called upon to provide significant impedance at $f_0$. This means that a relatively small number of turns of wire are required for inductors 39 and 43. This, in turn, means that the amount of flux generated by the baseband load currents $i_{L1}(t)$ and $i_{L2}(t)$—which do flow through inductors 39 and 43, respectively—is smaller than if the inductors had the higher inductance required to effectively filter at 1 MHz. The lower flux means that the size of inductors 39 and 43 can be physically much smaller and still not have their cores be saturated by the baseband currents flowing through them.

A similar effect holds true even more so for common-mode inductor 41. Since $[i_{L1}(t)+i_{L2}(t)] \approx 0$, the flux in the core of the common-mode inductor is very much smaller than the flux in an inductor carrying one of those currents alone. That greatly lower level of flux means that common-mode inductor can have a quite high level Of common-mode inductance, thereby being able to subtractively combine the common-mode fundamental switching frequency components at $f_0$, and yet can be physically small without its core saturating due to baseband current flow.

The difference in the total filtering component volume between prior art switching amplifiers and a switching amplifier embodying the principles of the invention is greater still because prior art switching amplifiers typically require multiple-pole load filters (e.g., load filter 19) in order to achieve the necessary roll-off and thus include more components than just a single inductor.

It was noted above that current $i_2(t) \ll i_1(t)$, so that most of the energy supplied from the power supplies is provided from power supply 31 rather than power supply 32. Indeed, power supply 32 does not supply any net energy—only oscillating energy. The reason for this has to do with the presence in the circuit of common-mode inductor 41. In particular, a significant amount of energy is stored by common-mode inductor 41 when signals PWM and PWM' are high, this being the consequence of common-mode inductor 41 forcing the common-mode (fundamental switching frequency) current to zero. That energy is thereupon returned to the circuit when signals PWM and PWM' are low. Indeed, such current $i_2(t)$ that does flow is a consequence of the fact that, like any real-world device, common-mode inductor 41 is not perfect and thus allows a residual amount of the switching signal fundamental frequency to flow through the loads.

There are a number of design considerations that are preferably to be taken into account in order for the switching amplifier to operate as efficiently and as effectively as possible. In particular, in order to make currents $i_{L1}(t)$ and $i_{L2}(t)$ as equal to one another as possible, it is desirable to make signals B and B' to be as close to the inverse of one another is possible. Moreover, in order to achieve the greatest degree of cancellation of the switching signal fundamental frequency, it is desirable for the triangle wave T to be as symmetric and noise-free as possible.

Another design consideration is the fact that common-mode inductor 41 will resonate with the common-mode capacitance of the loads L1 and L2. It is usually not desirable to have a resonance in the baseband. If it is observed in the course of design that the capacitance of loads L1 and L2 are such as to cause resonance in the baseband for a given common-mode inductance, it is recommended to select a different common-mode inductance so that its resonance with the load capacitances is below the baseband lowest frequency. This places a minimum value on the inductance of the common-mode inductor once the load impedance is known. In addition, inductors 39 and 43 should be sized to resonate with the load between the baseband upper frequency and twice the switching frequency.

In a particular embodiment of the invention, each of the two loads had a capacitance of about 330 nF, inductors 39 and 43 each had an inductance of ab out 3.9 microHenry and common-mode inductor had an inductance of about 750 microHenry.

Careful construction of the common-mode inductor 41 is also desirable. All common-mode inductors have a residual differential mode inductance. It is desirable to have the smallest residual differential mode inductance to minimize core flux and consequently core size. In addition, a small differential mode inductance increases the differential mode coil self resonant frequency improving its filtering action. To achieve this, the common-mode inductor is wound with a twisted pair of wires to insure the flux linking the two coils is as identical as is physically possible.

Figure 6A:
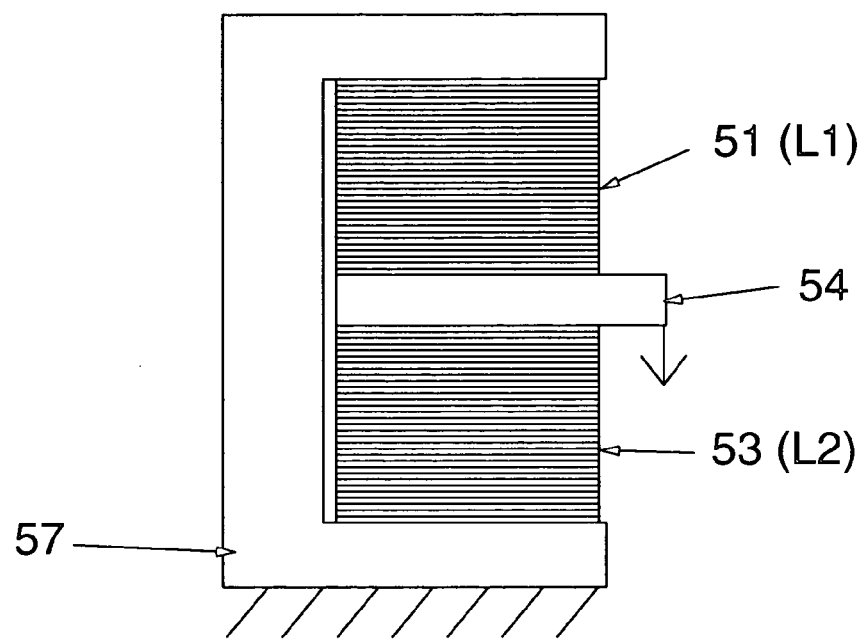
FIG. 6A is an example of a balanced piezoelectric stack actuator that can be driven by a switching amplifier embodying the principles of the present invention, the stacks being mechanically in parallel.

FIG. 6A shows an example of a balanced transducer design comprising piezoelectric transducers, or "stacks." A first stack 51 corresponds to load L1 and a second stack 53 corresponds to load L2. Stacks 51 and 52 are attached to a fixed frame 57. Stack 51 elongates (contracts) when stack 53 contracts (elongates), causing an armature 54 to move. Armature 54 is the attachment point for a mechanical load, such as a piston that generates an acoustic signal for use in a sonar system, as noted earlier.

Figure 6B:
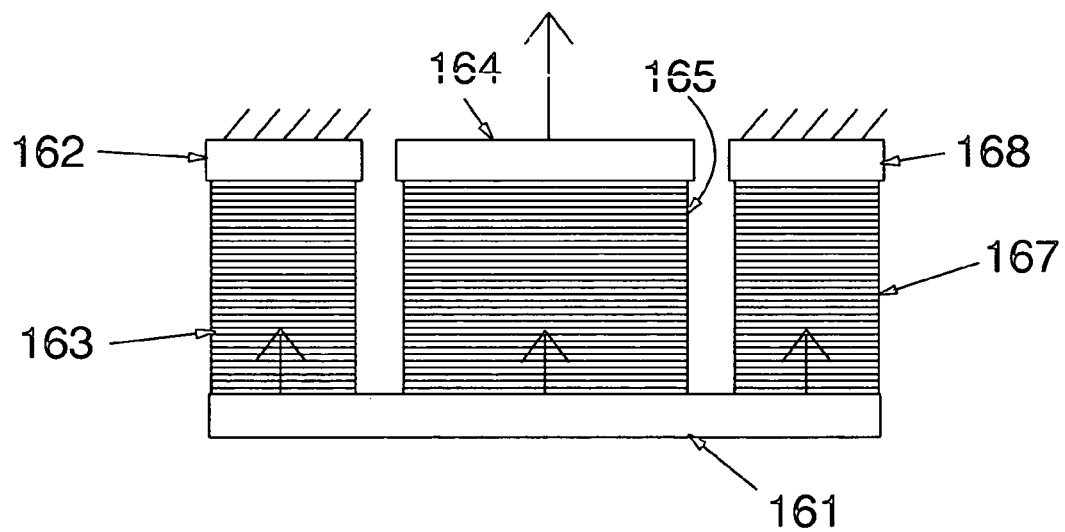
FIG. 6B is an example of a balanced piezoelectric stack actuator that can be driven by a switching amplifier embodying the principles of the present invention, the stacks being mechanically in series.

FIG. 6B shows another example of a balanced transducer design comprising three stacks. Stacks 163 and 167 are attached to fixed bases 162 and 168. These stacks are connected in parallel electrically and serve as load L1. The third, larger stack 165 serves as load L2. All three stacks are attached to a movable linking plate 161. Stack 163 and stack 167 contract (elongate) when stack 165 elongates (contracts), thereby moving the armature 164 which is the attachment point for the mechanical load. An advantage of this transducer design over that of FIG. 6A is that it has a lower mechanical impedance than that of 6A for the same volume of piezoelectric material.

Figure 4B:
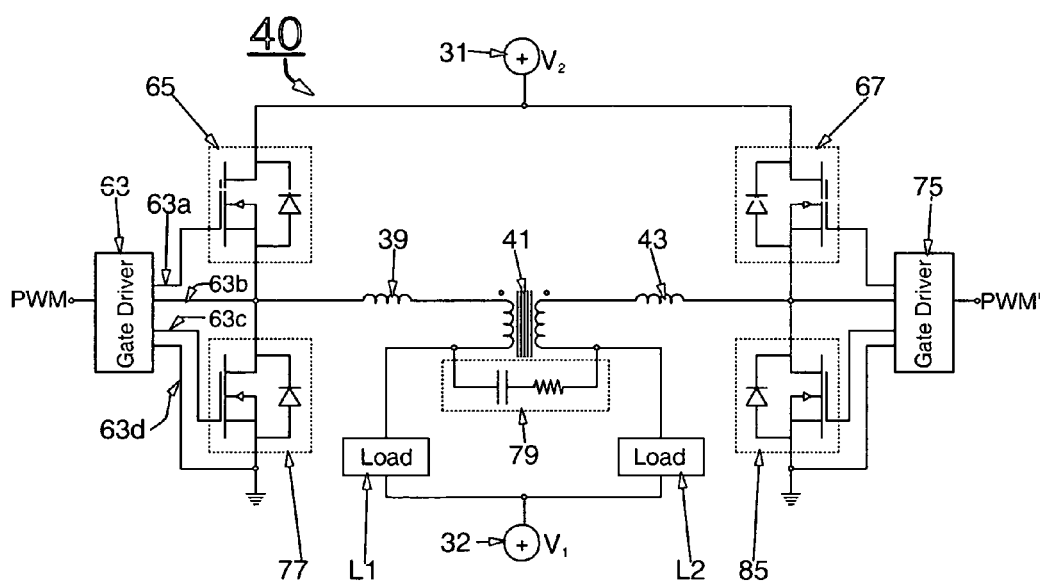
FIG. 4B is a circuit diagram of a switching amplifier similar to that shown in FIG. 4A but using only N channel FETs.

Switching amplifier 30 of FIG. 4A is a complementary design in which FETs 35 and 37 are N-channel devices and FETs 47 and 55 are P-channel devices. An alternative embodiment is switching amplifier 40 shown in FIG. 4B, which uses all N channel devices—FETs 65, 67, 77, 85.

Switching amplifier 40 functions in the same manner as switching amplifier 30 of FIG. 4A except that its gate drivers are configured differently in order to accommodate the use of all N channel devices. In particular, when signal PWM is high, lead 63a is at approximately +15 volts relative to lead 63b, thereby turning ON FET 65. Lead 63c is close to ground potential at that time; and since lead 63d is tied to ground, FET 77 is OFF. On the other hand, when signal PWM is low, leads 63a and 63b are both close to ground potential and FET 65 is OFF. At that time, lead 63c is at approximately +15 volts relative to ground, thereby turning FET 77 ON. Gate driver 75 similarly controls FETs 67 and 85 in response to signal PWM'.

An advantage of switching amplifier 40 is that N channel FETs perform better than P channel FETs. That advantage is achieved, however, at a slightly increased component count required by its gate drivers to carry out their functions as just described. It may also be noted that various types of switching devices other than FETs can be use in the various switching amplifiers disclosed herein as well as any other switching amplifiers embodying the principles of the present invention, as will be apparent to those skilled in the art. For example, switching amplifier 40 could be built using IGBTs rather than FETs.

Figure 7:
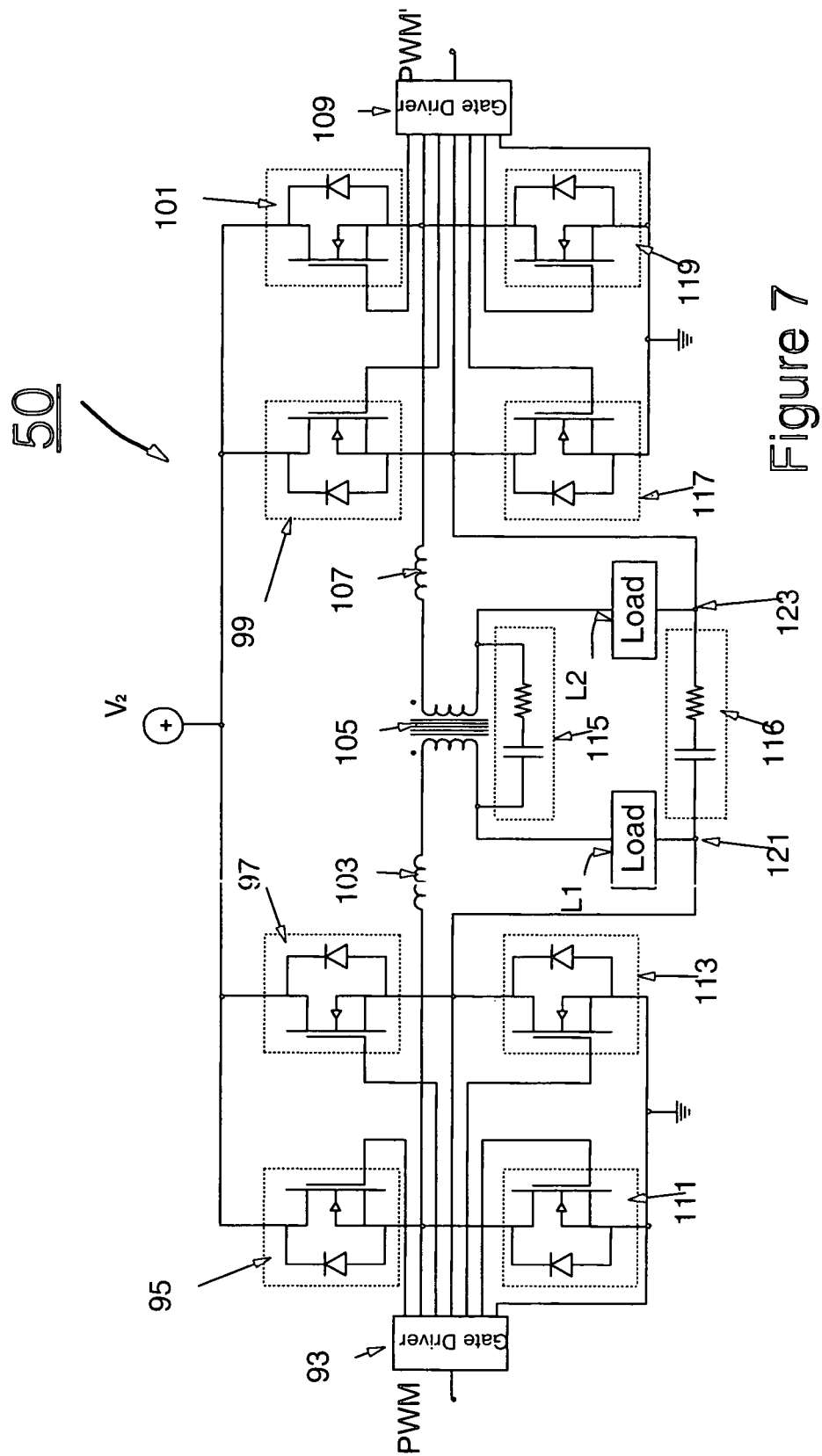
FIG. 7 is a balanced dual H-bridge switching amplifier embodying the principles of the invention.

Switching amplifier 50 in FIG. 7 is a further embodiment of the invention in which two H-bridges are used in place of the two half-bridges employed in switching amplifiers 30 and 40. In this embodiment, then, gate driver 93 controls an H-bridge consisting of FET switches 95, 97, 111, 113 in response to signal PWM and gate driver 109 similarly controls the H-bridge comprising FETs 99, 101, 117 and 119 in response to signal PWM'. These H-bridges operate similarly to the H-bridge described above in connection with switching amplifier 10 in FIG. 1.

Other than the operation of the H-bridges themselves and the presence of a second RC bypass filter 116, switching amplifier 50 operates in substantially the same manner as switching amplifiers 30 and 40.

A disadvantage of using H-bridges is that the component count is higher than for the half-bridge amplifier. Higher component count means that H-bridge implementation will be physically larger than an equivalent half-bridge implementation. A further disadvantage is that the load is not easily biased. However, the maximum peak voltage across the loads is $V_2$ in the H-bridge case. That is, the maximum peak-to-peak voltage is $2V_2$. In the half-bridge case, the maximum peak and peak-to-peak voltages across the loads are half of those amounts, i.e., $\frac{1}{2} V_2$ and $V_2$, respectively. The capability of driving the loads with larger voltages is advantageous if the load impedance is such that higher voltages are needed to achieve a desired level of load current in order to operate the loads.

Figure 8:
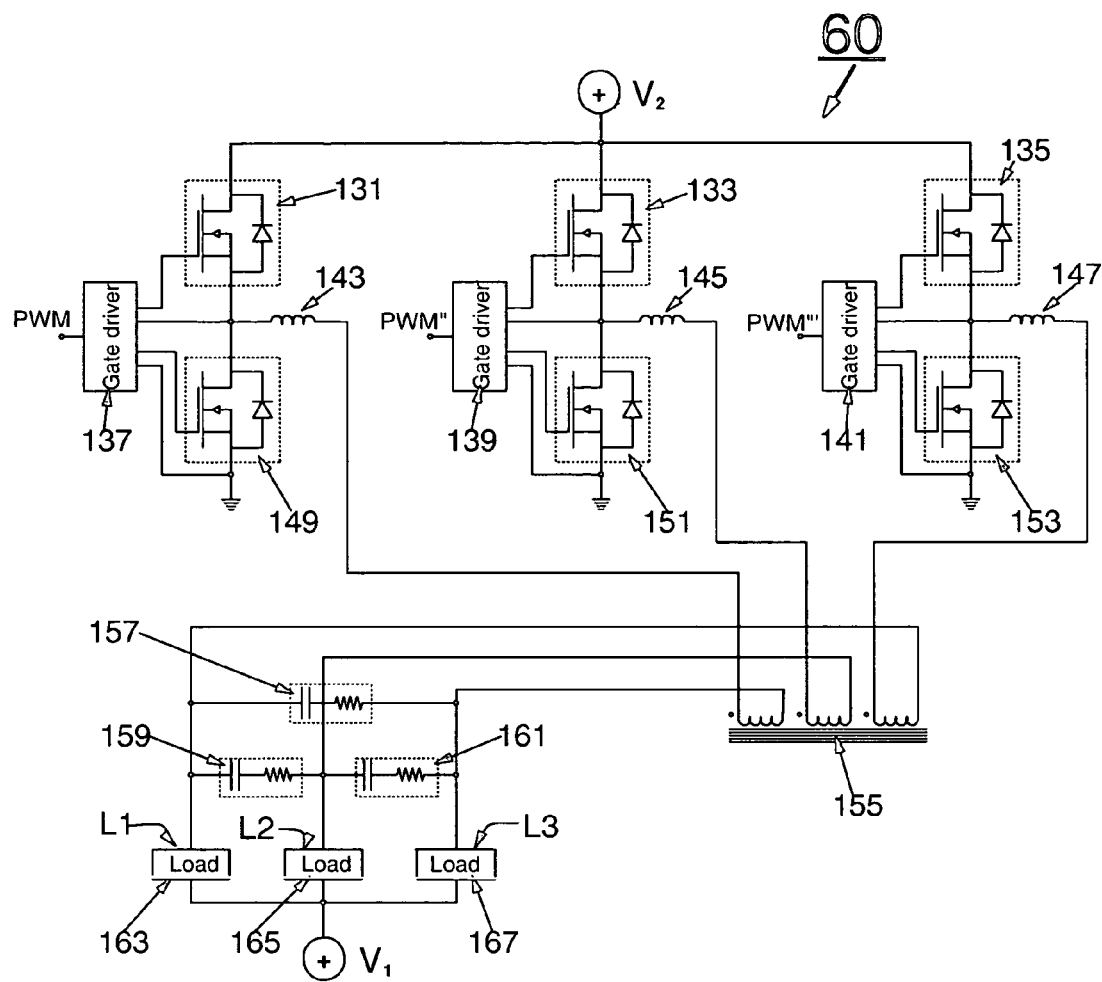
FIG. 8 is a three-phase balanced amplifier embodying the principles of the invention using half-bridge switches.

FIG. 8 shows an embodiment of the invention—switching amplifier 60—in which three loads are driven using a three-phase baseband signal rather than two loads being driven by a two-phase baseband signal as in the embodiments described hereinabove. The three loads could be coupled to a shaft, for example, to realize a three-phase piezoelectric motor.

Switching amplifier 60 includes three gate drivers 137, 139 and 141 driving respective half-bridges, the first half-bridge comprising FET switches 131 and 149, the second comprising FET switches 133 and 151, and the third comprising FET switches 135 and 153. Connected to the three gate drivers are load inductors 143, 145 and 147. The signals PWM, PWM" and PWM'" applied by the three gate drivers to their respective half-bridges and load inductors are generated in the same manner as signals PWM and PWM' described earlier except that the phasing of their respective baseband signals is different. Signals PWM, PWM" and PWM'" are generated by comparing a three-phase baseband signal to a switching waveform, such as triangle wave T, in a manner that is analogous to the two-phase case as shown in FIGS. 2A and 2B. The three baseband signals are constructed so that their sum is zero at all times, just as in the two-phase case. This guarantees that the total charge on three substantially identical capacitive loads L1, L2 and L3 will be constant, thereby achieving a very low level of baseband current flowing betwe4en the amplifier and the power supplies. The three-phase common-mode inductor 155 has a sufficiently high impedance at the fundamental switching frequency to effectively block common-mode current from flowing in the loads L1, L2 and L3. As in the two-phase case, since the baseband three-phase currents add to zero, the flux in the core of the common-mode inductor 155 is small compared to the flux of an inductor carrying the base band current of one of the phases alone.

The three-phase common-mode inductor 155 has a low impedance to three-phase signals, that is three signals with no common-mode content, and minimally impedes the flow of three-phase baseband differential currents to the loads. Inductors 143, 145 and 147 are similar to, for example, inductors 39 and 43 of switching amplifier 30. Residual three-phase switching band currents are kept out of the loads by RC bypass filters, 157, 159, 161.

As in the two-phase amplifier, the loads can be biased with the selection of $V_1$.

All in all, three-load switching amplifier 60 exhibits the same advantages as the two-load switching amplifiers described hereinabove.

Figure 9:
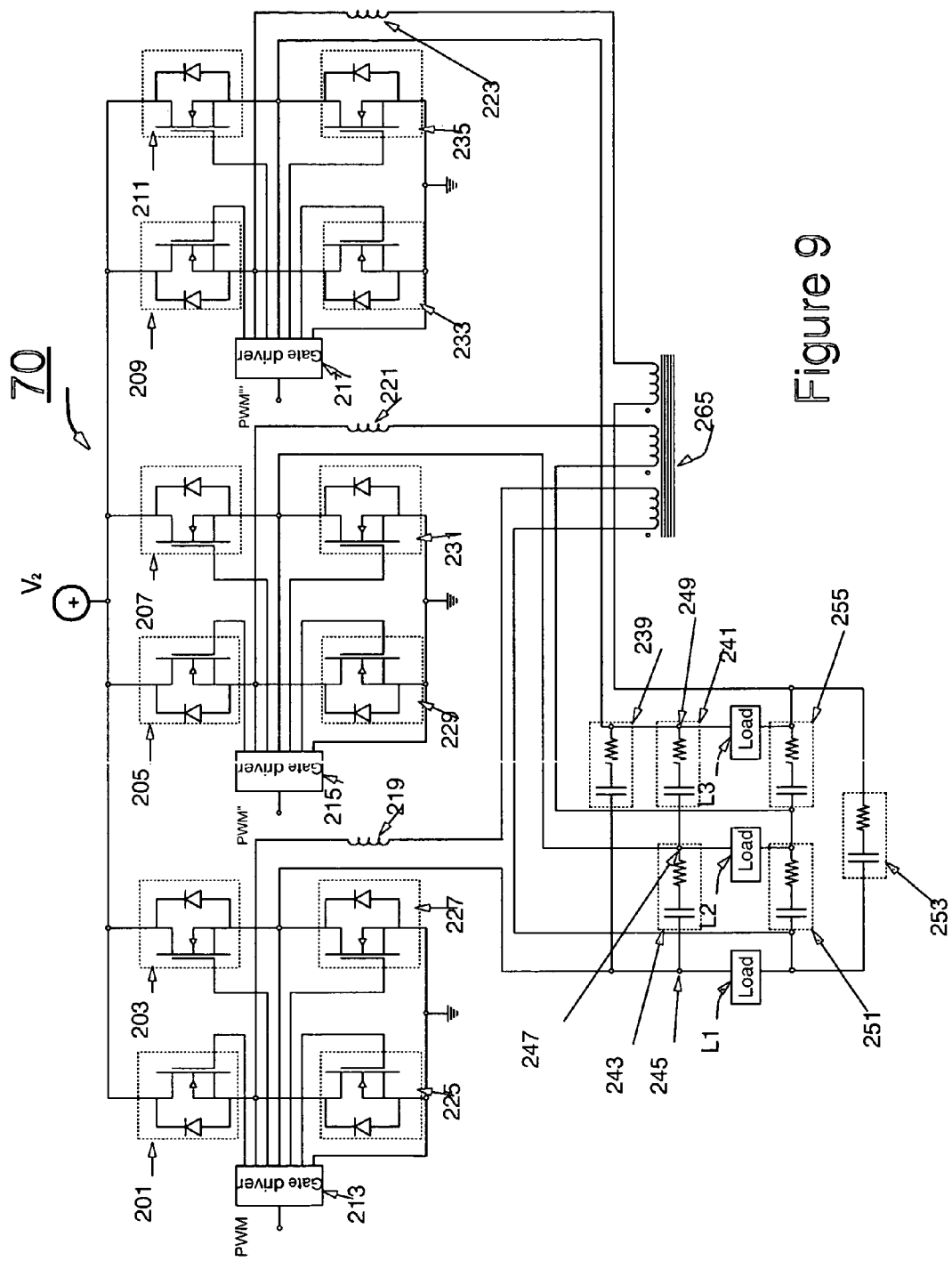
FIG. 9 is a switching amplifier similar to that shown in FIG. 8 but using H-bridge switches rather than half-bridge switches.

FIG. 9 shows another three-load, three-phase switching amplifier—switching amplifier 70—that is similar to switching amplifier 60 but uses H-bridge switching rather than half-bridge switching. Here gate drivers 213, 215, 217 control the FETs such that when the signals PWM. PWM" and PWM'" are high (low), inductors 219, 221 and 223 are connected to $+V_2$ (ground) and nodes 245, 247 and 249 are connected to ground ($+V_2$). To this end, switches 201 and 227 are ON (OFF) when switches 203 and 225 are OFF (ON), switches 205 and 231 are ON (OFF) when switches 207 and 229 are OFF (ON), and switches 209 and 235 are ON (OFF) when switches 211 and 233 are OFF (ON). This circuit includes common-mode inductor 265.

As noted above relative to switching amplifier 60, an advantage of using H-bridges is that a larger voltage swing can be imposed across the loads if the load impedance makes that necessary.

Residual three-phase switching band currents are kept out of the loads by RC bypass filters, 239, 241, 243, 251, 253, 255.

The circuitry shown in FIGS. 8 and 9 can be generalized to switching amplifiers having four or more loads driven by a corresponding number of switching signals generated in response to appropriately phased baseband signals. This is simply a matter of adding more gate drivers, half-bridge or H-bridge sections, coils on the common-mode inductor, more identical loads, and more phases to the baseband signal.

In the claims hereof any element expressed as a means for performing a specified function is intended to encompass any way of performing that function including, for example, a combination of circuit elements that performs that function. The invention defined by such claims resides in the fact that the functionalities provided by the various recited means are combined and brought together in the manner which the claims call for. The present inventors thus regard any means which can provide those functionalities as equivalent as those shown herein.

The foregoing merely illustrates the principle's of the present invention, and various alternative arrangements embodying those principles may be devised by those skilled in the art. Some of those alternatives will now be described.

The various signal and component values used in the embodiments are merely illustrative and can be changed to suit the application.

Various switching arrangements that may be known now or in the future might be used, other than the H-bridges and half-bridges used in the illustrative embodiments disclosed herein.

The invention is not limited to driving piezoelectric devices. Electrostrictive and air gap capacitive transducers behave in a similar manner and may be advantageously driven using the switching amplifier of the present invention. Nor is the invention limited to devices whose impedance is capacitive. Any reactive impedance stores energy and can therefore be advantageously driven using the switching amplifier of the present invention. For example, magnetic transducers present an inductive load impedance associated with magnetic stored energy that is not converted into mechanical work. It will thus be appreciated that the invention can be used in conjunction with any transducer technology which can present reactive load impedances to the amplifier.

The function provided by the common mode inductor in the illustrative embodiments can be achieved by other means or by more complex filters with improved filtering characteristics or improved other properties such as size and weight. An example might be to use piezoelectric transformers rather than magnetic transformers to perform the generalized "common mode" filtering function.

Any modulation technique, choice of base band signals, choice of loads that achieves the objectives that the sum of the currents in the common-mode inductor is approximately zero and that the PWM switching frequency signals cancel at $f_0$, will work. The loads do not have to be matched as long as the base band signals are adjusted so that the sum of the base band currents in the common-mode inductor are small compared to sum of the magnitudes of the currents. For the situation of three or more loads the requirement the base band currents sum to a small value is not very constraining and the additional degrees of freedom allow very complex not identical base band waveforms to be used. These additional degrees of freedom can also be used to construct base band signals which result in the cancellation of multiples of $f_0$, further reducing the load filtering requirements. For example for a 3-phase system, $f_0$ and $2f_0$ can be canceled as there are two relative amplitudes and relative phases that can be adjusted to achieve the cancellation.

The loads do not have to be mechanically coupled. In the description it was pointed out that a single piezoelectric load can be driven with the other load being a simulation constructed from conventional passive electronics components. The mechanical coupling is only to transfer the output mechanical work to a single load because that is usually the desired mode of operation in practice. It is not a requirement.

The signal chosen for the example, a 75 kHz tone for the base band signal and 1 MHz for the switching signal are only examples to simplify the description of operation. In practice the base band signal is arbitrary and broad band. The amplifier operation is not changed by the use of broad band base band signals.

The DC bias function only depends on the load having an impedance that is sufficiently high that the zero frequency current flowing through the loads is very small compared to the current flowing out of the power supply $V_2$. For capacitive loads this current is the leakage current in the load which is usually nanoamps or zero for all practical purposes. Under these conditions the value of $V_1$ can be anything and is only constrained by the breakdown voltage of the load.

Different biases can be applied to each of the loads, but that has the disadvantage of having the large load currents flowing through a power supply.

Inductive loads can be driven but since their impedance is very low at zero frequency would not be operated in a biased mode.

The loads do not need to be balanced in order to achieve a substantially net zero baseband current flowing in the loads. For example, that constraint is achieved even if the loads are not balanced as long as the common mode inductor impedance is large compared to the load impedances at baseband frequencies. For capacitive loads this means that the total charge stored in the loads is constant.

Moreover, even if the common mode inductor impedance is not large compared to the load impedances at baseband frequencies, a net load current that is substantially equal to zero can still be achieved even with unbalanced loads—and/or even with a common mode inductor having windings with differing numbers of turns—by appropriate design of the PWM signals that are used to drive each load, including choice of the amplitude and/or phase of both the switching waveform and of the baseband signal that are used to generate each PWM signal. (It should be understood that if the number of turns on the inductor are not equal for each channel, then the terminology "common mode" would not be being used in the conventional sense but in a generalized sense.) It will thus be appreciated that although in the disclosed embodiments the same switching waveform is used to generate all the PWM signals and the baseband signals that are used to generate the various PWM signals in a given embodiment have the same amplitude, this may not may not be the case in other embodiments.

Although particular embodiments of the invention seek to minimize the net flow of current through the loads, other signal variable constraints can be accommodated. For example, it may be desired in a particular application to ensure that the total energy consumed by the loads remains constant, this being a constraint that does not require that the net current through the loads be constant, e.g., at zero. It is true that allowing the net currents through the loads to be substantially non-zero may compromise the advantages noted hereinabove that result from the net current being at or close to zero, but this may not be a concern in a particular application, whereas it may be quite important to achieve a constant total level of energy consumption or power consumption.

In general, through appropriate design of the PWM signals in combination with the parameter values of the circuit components, a switching amplifier embodying the principles of the invention can achieve the result that for at least one signal variable for each load, the sum of the values of that particular signal variable is constrained to be substantially constant. These include such load signal variables as a) current (as in the disclosed embodiments), b) voltage, c) charge, and d) energy as well as e) load signal variables that are functions of one or more of a) through d).

Moreover, a switching amplifier embodying the principles of the invention driving N loads can simultaneously achieve the foregoing result for any number of load signal variables less than N. Thus, for example, through appropriate design of the PWM signals in combination with the parameter values of the circuit components, a switching amplifier embodying the principles of the invention in which there are three loads could accommodate the constraint that the net current through the loads is substantially a constant, e.g., zero, as well as the constraint that the total energy stored in the three loads is a constant.

It will thus be appreciated that those skilled in the art will be able to devise numerous arrangements which, although not explicitly shown or described herein, embody the principles of the invention and are within their spirit and scope.

The invention claimed is:

1. Apparatus comprising
at least first and second reactive loads,
a first circuit means that generates a first switching signal and includes switching elements with respective control terminals,
a second circuit means that generates a second switching signal and includes switching elements with respective control terminals,
means for generating a first PWM signal that includes a fundamental switching band signal component of the first switching signal and that further includes a baseband signal and for applying said first PWM signal to said control terminals of said first circuit means,
means for generating a second PWM signal that includes a fundamental switching band component of the second switching signal that has substantially the same magnitude and phase as the fundamental switching band component of said first PWM signal, and that further includes a baseband signal that is the inverse of said baseband signal that is included in the first PWM signal, and for applying said second PWM signal to said control terminals of said second circuit means,
wherein at least one of said reactive loads is a capacitive load.

2. The invention of claim 1 wherein the first and second circuit means function so as to work with the means for generating a first PWM signal and with the means for generating a second PWM signal to generate the switching signals in such a way that a) the sum of the values of the instantaneous currents through said each load is substantially zero, b) substantially all of said at least one baseband component of said first switching signal is a current that flows into said first reactive load and c) substantially all of said at least one baseband component of said second switching signal is a current that flows into said second reactive load.

3. The invention of claim 2 wherein there are N of said loads, wherein for each of a number of signal variables for each load, the sum of the values of each particular signal variable is substantially constant, and wherein said number of signal variables is greater than 1 and less than N.

4. The invention of claim 1 wherein respective first terminals of each of said reactive loads are connected to a common node through which said current at baseband frequencies flows, said common node being connected to a fixed potential.

5. The invention of claim 4 wherein each of said reactive loads has a second terminal and wherein said apparatus further comprises means for applying at least the baseband components of said first switching signal between the second terminal of said first reactive load and said common node and for applying at least the baseband components of said second switching signal between the second terminal of said second reactive load and said common node.

6. The invention of claim 1 further comprising a mechanical load connected to said capacitive load.

7. The invention of claim 6 wherein said mechanical load includes means for generating acoustic sonar signals.

8. The invention of claim 1
wherein the first and second circuit means function so as to work with the means for generating a first PWM signal and with the means for generating a second PWM signal to generate the switching signals in such a way as to cause a) substantially the same amount of current at baseband frequencies that flows out of one or more of said reactive loads at a given time to flow into one or more of the others of said reactive loads, b) substantially all of said at least one baseband component of said first switching signal to be a current that flows into said first reactive load and c) substantially all of said at least one baseband component of said second switching signal to be a current that flows into said second reactive load.

9. The invention of claim 8 further comprising means for connecting respective first terminals of each of said reactive loads to a common power supply node through which said current at baseband frequencies flows.

10. The invention of claim 9 wherein each of said reactive loads has a second terminal and wherein said apparatus further comprises means for applying at least the baseband components of said first switching signal between the second terminal of said first reactive load and said common node and for applying at least the baseband components of said second switching signal between the second terminal of said second reactive load and said common node.

11. The invention of claim 10 wherein said apparatus is further adapted to drive a third reactive load with a third switching signal, said third switching signal having switching band components and at least one baseband component, said third reactive load having a second terminal, and wherein said apparatus further comprises means for applying the at least one baseband component of said third switching signal between the second terminal of said third reactive load and said common node.

12. The invention of claim 8 wherein said reactive loads have substantially equal impedance and wherein said baseband components are the inverse of one another.

13. The invention of claim 8 wherein said apparatus further includes at least one power supply terminal and wherein said current flowing out of one or more of said reactive loads flows away from said power supply terminal and said current flowing into one or more of the others of said reactive loads flows toward said power supply terminal.

14. The invention of claim 13 wherein the phases and amplitudes of said baseband components are such that said currents add to zero at substantially all times.

15. The invention of claim 13 wherein respective first terminals of each of said reactive loads are connected to a common node through which said current at baseband frequencies flows, said common node being at a fixed potential.

16. The invention of claim 8 wherein there are two of said loads, wherein said two loads have substantially equal impedances and wherein the baseband components of said first and second switching signals are of substantially equal magnitude and are substantially the inverse of one another.

17. The invention of claim 8 wherein said apparatus is further adapted to drive a third reactive load with a third switching signal, wherein said first, second and third loads have substantially equal impedances and wherein the baseband components of said first, second and third switching signals are such that they add to zero at substantially all times.

18. The invention of claim 8 further comprising a mechanical load connected to said transducer.

19. The invention of claim 18 wherein said mechanical load includes means for generating acoustic sonar signals.

20. The invention of claim 8 wherein said apparatus further includes at least first and second signal paths containing said first and second loads, respectively.

21. The invention of claim 20 wherein alternating polarity currents flow in said first and second signal paths in response to said first and second switching signals, respectively.

22. The invention of claim 21 wherein said first and second switching signals are generated in response to first and second pulse-width-modulated signals, respectively.

23. The invention of claim 20 wherein said apparatus further includes means for applying said first and second switching signals to said first and second signal paths, respectively, in such a way that at least one switching band component of said first switching signal and at least one switching band component of said second switching signal cancel each other and therefore are substantially isolated from said reactive loads.

24. The invention of claim 23 wherein alternating polarity currents flow in said first signal path in response to said first switching signal and alternating polarity currents flow in said second signal path in response to said second switching signal.

25. The invention of claim 23 wherein
said at least one switching band component of said first switching signal and said at least one switching band component of said second switching signal are the fundamental frequency components of said first and second switching signals, respectively, and are of substantially the same amplitude and phase, and
said means for applying comprises a common-mode inductor in said first and second signal paths.

26. The invention of claim 20 wherein said apparatus is further adapted to drive a third reactive load with a third switching signal, wherein said switching amplifier includes at least a third signal path containing said third reactive load, and wherein said apparatus further includes means for applying said first, second and third switching signals to said first, second and third signal paths, respectively, in such a way that at least one switching band component of each of said first, second and third switching signals cancel each other and therefore are substantially isolated from said reactive loads.

27. The invention of claim 26 wherein alternating polarity currents flow in said first signal path in response to said first switching signal, alternating polarity currents flow in said second signal path in response to said second switching signal, and alternating polarity currents flow in said third signal path in response to said third switching signal.

28. The invention of claim 26 wherein
said at least one switching band component of said first, second and third switching signals are of substantially the same amplitude and phase, and
said means for applying comprises a common-mode inductor in said first, second and third signal paths.

29. The invention of claim 20 wherein
each of said reactive loads includes a first terminal and a second terminal,
the first terminals of each of said reactive loads are connected to a common node through which said current at baseband frequencies flows, said common node being adapted to be connected to a fixed potential,
each said path includes filtering circuitry connected to the second terminal of the respective reactive load, and
each of said first and second switching signals comprises an alternating polarity signal impressed across said first and second signal paths, respectively.

30. The invention of claim 20 wherein
each of said reactive loads includes a first terminal and a second terminal,
the first terminals of each of said reactive loads are connected to a common node through which said current at baseband frequencies flows, said common node being connected to a fixed potential,
each said path includes filtering circuitry connected to the second terminal of the respective reactive load, and
said first and second switching signals comprise respective signals at first and second potentials applied to the filtering circuitry of said first and second signal paths, respectively.

31. The invention of claim 30 wherein
said second potential is substantially equal to said fixed potential, and
said filtering circuitry includes at least one energy storage element that stores energy when each said switching signal is at said first potential and that supplies energy to said reactive loads when each said second node is connected to said second potential.

32. The invention of claim 31 wherein
said energy storage element is a common-mode inductor having first and second ports in said first and second paths, respectively, and
said first and second switching signals have respective fundamental switching band components that are of substantially equal magnitude and phase that are canceled by said common-mode inductor.

33. A switching amplifier operating at a particular switching frequency, the switching amplifier comprising
at least first and second circuit paths,
each of said paths comprising switching circuitry, a load filter, a respective port of a common-mode inductor and a transducer, all connected in series, each transducer having a terminal that is connected to a power supply node in common with each other transducer, each load filter having a passband that includes said particular switching frequency and having a stop band at frequencies higher than said particular switching frequency,
said switching circuitry being operative in response to a first pulse-width-modulated signal to cause first and second voltages of a first switching signal to be alternatively impressed between the load filter of said first circuit path and said common node and being further operative in response to a second pulse-width-modulated signal to cause first and second voltages of a second switching signal to be alternately impressed between the load filter of said second circuit path and said common node,
said first and second switching signals having respective fundamental switching components that are of substantially equal magnitude and phase so that they are canceled by said common-mode inductor, said first and second switching signals each further having at least one respective baseband component, the baseband components of said first and second switching signals being such that substantially the same amount of current at baseband frequencies flowing out of one or more of said transducers at a given time flows into one or more of the others of said transducers, and
substantially all of said at least one baseband component of said first switching signal being a current that flows into one of said transducers and substantially all of said at least one baseband component of said second switching signal being a current that flows into another of said transducers.

34. The invention of claim 33 wherein the phases and amplitudes of said baseband components are such that said currents add to zero at substantially all times.

35. The invention of claim 33 wherein said transducers have substantially equal impedance and wherein said baseband components are the inverse of one another.

36. The invention of claim 33 wherein said switching amplifier includes at least one power supply terminal and wherein said current flowing out of one or more of said transducers flows away from said power supply terminal and said current flowing into one or more of the others of said transducers flows toward said power supply terminal.

37. The invention of claim 33 wherein there are two of said transducers having substantially equal impedances and wherein the baseband components of said first and second switching signals are of substantially equal magnitude and are substantially the inverse of one another.

38. The invention of claim 37 wherein a mechanical load is connected to at least one of said transducers.

39. The invention of claim 38 wherein said mechanical load includes means for generating acoustic sonar signals.

40. Apparatus comprising:
N reactive loads, wherein N greater than or equal to 2, N circuit means each of which generate a respective switching signal and includes switching elements with respective control terminals, N PWM generating means each for generating a respective PWM signal and for applying said respective PWM signal to said control terminals of a respective one of said circuit means, wherein each PWM signal includes a) a fundamental switching band signal component of a respective one of the switching signals, wherein the fundamental switching band signal components all have substantially the same magnitude and phase as one another and b) a baseband signal, wherein the baseband signals of the PWM signals add to zero at substantially all times, and wherein at least one of said reactive loads is a capacitive load.

* * * * *